(12) United States Patent
Shih et al.

(10) Patent No.: US 11,616,069 B2
(45) Date of Patent: Mar. 28, 2023

(54) SEMICONDUCTOR STRUCTURE AND MANUFACTURING METHOD THEREOF

(71) Applicant: UNITED MICROELECTRONICS CORP., Hsinchu (TW)

(72) Inventors: Ping-Chia Shih, Tainan (TW); Kuei-Ya Chuang, Chiayi County (TW); Chuang-Hsin Chueh, New Taipei (TW); Ming-Che Tsai, Tainan (TW); Wen-Lin Wang, Kaohsiung (TW); Yi-Chun Teng, Taichung (TW); Ssu-Yin Liu, Kaohsiung (TW); Wan-Chun Liao, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 123 days.

(21) Appl. No.: 17/073,443

(22) Filed: Oct. 19, 2020

(65) Prior Publication Data

US 2022/0077166 A1 Mar. 10, 2022

(30) Foreign Application Priority Data

Sep. 7, 2020 (CN) .......................... 202010927132.4

(51) Int. Cl.
*H01L 27/11521* (2017.01)
(52) U.S. Cl.
CPC .............................. *H01L 27/11521* (2013.01)
(58) Field of Classification Search
CPC ......... H01L 29/42372; H01L 29/42376; H01L 29/42324
See application file for complete search history.

(56) References Cited

U.S. PATENT DOCUMENTS

| | | | |
|---|---|---|---|
| 5,045,488 A | 9/1991 | Veh | |
| 5,597,751 A * | 1/1997 | Wang | H01L 27/115 438/266 |
| 5,780,892 A * | 7/1998 | Chen | H01L 29/7885 257/317 |
| 6,309,928 B1 | 10/2001 | Sung et al. | |
| 6,420,233 B1 * | 7/2002 | Hsieh | H01L 29/40114 438/257 |
| 6,486,508 B1 * | 11/2002 | Lee | H01L 29/42324 438/257 |
| 6,620,683 B1 * | 9/2003 | Lin | H01L 21/28211 438/257 |
| 2002/0093044 A1 * | 7/2002 | Hsieh | H01L 27/115 257/315 |
| 2006/0244042 A1 * | 11/2006 | Jeon | H01L 27/11521 257/E29.302 |
| 2019/0363164 A1 * | 11/2019 | Liu | H01L 29/40114 |
| 2020/0176609 A1 * | 6/2020 | Kumar | H01L 29/4916 |

* cited by examiner

*Primary Examiner* — John A Bodnar
(74) *Attorney, Agent, or Firm* — WPAT, PC

(57) ABSTRACT

The present application discloses a semiconductor structure and a manufacturing method thereof. The semiconductor structure comprises a substrate, a gate dielectric layer, a floating gate, a first dielectric layer and a control gate. The gate dielectric layer is disposed on the substrate. The floating gate is disposed on the gate dielectric layer and has at least one tip on a top surface of the floating gate. The first dielectric layer is disposed on the floating gate. The control gate is disposed above the first dielectric layer and at least partially overlaps the floating gate.

17 Claims, 8 Drawing Sheets

SEMICONDUCTOR STRUCTURE AND MANUFACTURING METHOD THEREOF

This application claims the benefit of People's Republic of China application Serial No. 202010927132.4, filed Sep. 7, 2020, the subject matter of which is incorporated herein by reference.

BACKGROUND OF THE INVENTION

Field of the Invention

The invention relates in general to a semiconductor structure and a manufacturing method thereof, and more particularly to a flash memory structure and a manufacturing method thereof.

Description of the Related Art

Flash memory has been widely developed and used in the past decades. Among the various types of flash memories, embedded super flash memory requires high-speed program and erase operations. In order to achieve high-speed program and erase operations, a large amount of researches and developments in manufacturing as well as improving the structures of such devices have been disclosed.

SUMMARY OF THE INVENTION

One embodiment of the present application discloses a semiconductor structure. The semiconductor structure comprises a substrate, a gate dielectric layer, a floating gate, a first dielectric layer and a control gate. The gate dielectric layer is disposed on the substrate. The floating gate is disposed on the gate dielectric layer and has at least one tip on a top surface of the floating gate. The first dielectric layer is disposed on the floating gate. The control gate is disposed above the first dielectric layer and at least partially overlaps the floating gate.

Another embodiment of the present application discloses a manufacturing method of a semiconductor structure. The method comprises the following steps: providing a substrate; forming a gate dielectric layer on the substrate; forming a floating gate on the gate dielectric layer, wherein the floating gate has at least one tip on a top surface of the floating gate; forming a first dielectric layer on the floating gate; and forming a control gate above the first dielectric layer, wherein the control gate at least partially overlaps the floating gate.

In accordance with the aforementioned embodiments of the present disclosure, a semiconductor structure and a manufacturing method thereof are provided. By disposing a floating gate having one tip and disposing a control gate at least partially overlapping the floating gate, the present application have advantages of reducing the erase path between the floating gate and control gate, reducing the memory cell size, enhancing process quality, lowering operation voltage, increasing endurance, and achieving high-speed program and erase operations.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
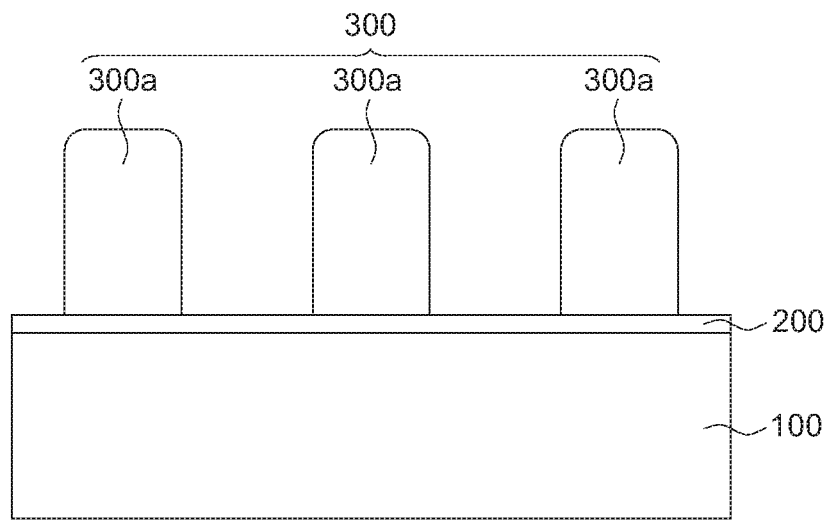
FIGS. 1A to 1H are cross-sectional views illustrating a series of the processing structure for fabricating a semiconductor structure, in accordance with first embodiment of the present disclosure.

The present disclosure provides a semiconductor structure and a manufacturing method thereof. By disposing a floating gate having one tip and disposing a control gate at least partially overlapping the floating gate, the present application have advantages of reducing the erase path between the floating gate and control gate, reducing the memory cell size, enhancing process quality, lowering operation voltage, increasing endurance, and achieving high-speed program and erase operations. The above embodiments and other purposes, features and advantages of the present disclosure will become better understood with regard to the following detailed description of the preferred but non-limiting embodiment(s). The following description is made with reference to the accompanying drawings.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Besides, the ordinal numbers, such as "the first", "the second", and "the third", are used in the specification and the claims for modifying claim elements only, neither implying nor indicating that the claim elements have any previous ordinal numbers. The ordinal numbers do not indicate the sequence between one claim element and another claim element or the sequence in the manufacturing method. The ordinal numbers are used for clearly differentiating two claim elements having the same designation.

First Embodiment

FIGS. 1A to 1H are cross-sectional views illustrating a series of the processing structure for fabricating a semiconductor structure 10, in accordance with first embodiment of the present disclosure.

Referring to FIG. 1A, firstly provide a substrate 100. Then form a gate dielectric material layer 200 on the substrate 100. Then form a patterned mask layer 300 above the substrate 100. In one embodiment, the patterned mask layer 300 comprises patterned portions 300a, and the patterned portions 300a are on the gate dielectric material layer 200.

For instance, the substrate 100 may comprise silicon (Si), germanium (Ge) or gallium arsenide (GaAs), but the present disclosure is not limited thereto. For instance, the gate dielectric material layer 200 may comprise silicon oxide ($SiO_x$) or high k material, but the present disclosure is not limited thereto. For instance, the patterned portions 300a of the patterned mask layer 300 may comprise silicon nitride, but the present disclosure is not limited thereto. For example, in the present embodiment, the steps of forming the patterned mask layer 300 comprise: forming a silicon nitride layer on the gate dielectric material layer 200, performing a photoresist etching process, removing a portion of the silicon nitride layer, and forming the patterned mask layer 300 having the patterned portions 300a on the gate dielectric material layer 200.

Figure 1B:
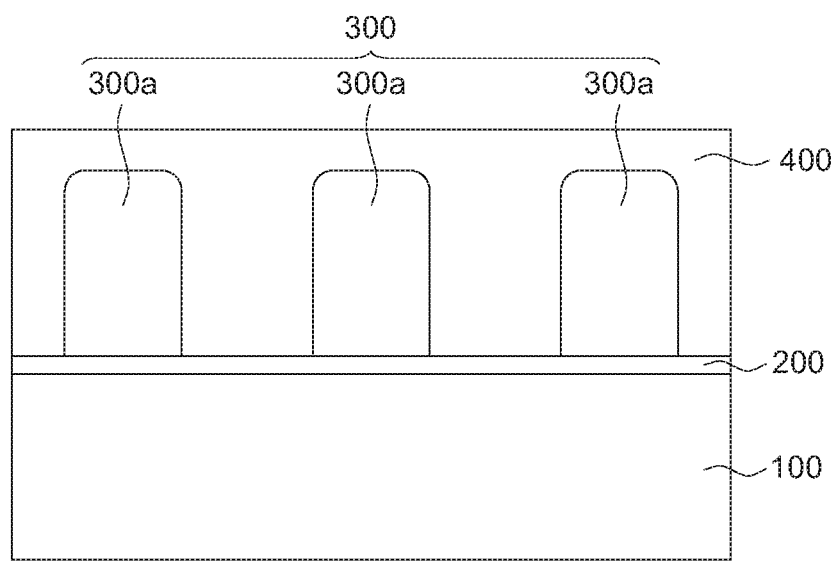

Referring to FIG. 1B, deposit a conductive material layer 400 on the patterned portions 300a of the patterned mask layer 300. Thereafter, planarize the conductive material layer 400 to make the conductive material layer 400 fill in the recess or space between two adjacent patterned portions 300a. For instance, the conductive material layer 400 may comprise (but not limited to) doped poly-silicon, silicon (Si), germanium (Ge), metal, or other conductive material.

Figure 1C:
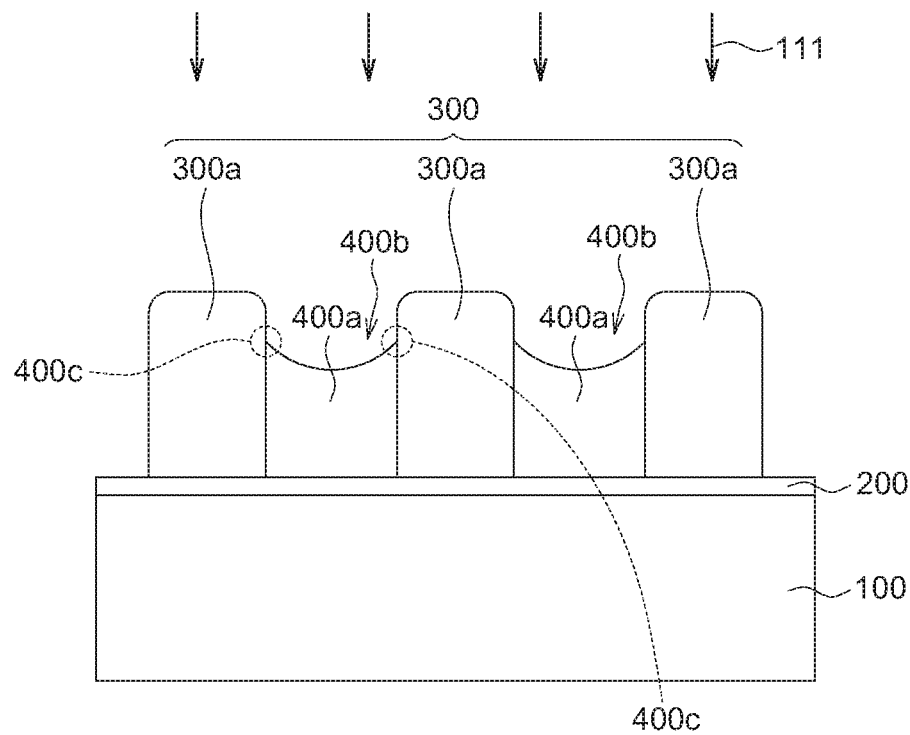

Referring to FIG. 1C, perform an etching process 111 using the patterned mask layer 300 as a stop layer without using any etching mask, to remove a portion of the conductive material layer 400. In one embodiment, the etching process 111 is such as an anisotropic dry etch, but the present disclosure is not limited thereto. Due to the difference in etch selectivity between the patterned mask layer 300 and the conductive material layer 400, after the etching process 111, a portion of the conductive material layer 400 remaining between two adjacent pattern portions 300a forms a conductive block 400a. The conductive block 400a has a top recess 400b and two tips 400c on two opposite sides of the top recess 400b. In other words, the two tips 400c are adjacent the two opposite sidewalls of the conductive block 400a, respectively.

Figure 1D:
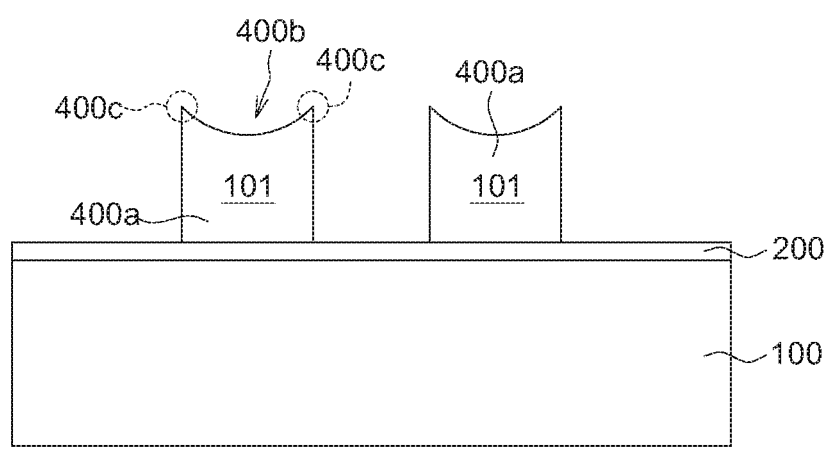

Referring to FIG. 1D, remove the patterned portions 300a of the patterned mask layer 300 so as to remain conductive blocks 400a on the gate dielectric material layer 200. In one embodiment, each of the conductive blocks 400a may sever as a floating gate 101 of the semiconductor structure 10. For instance, a thickness of the floating gate 101 is between 200 Å and 1000 Å, but the present disclosure is not limited thereto. For briefly and clearly expressed, FIG. 1D illustrates only two conductive blocks 400a. However, in other embodiments, there may be more conductive blocks 400a on the gate dielectric material layer 200.

Figure 1E:
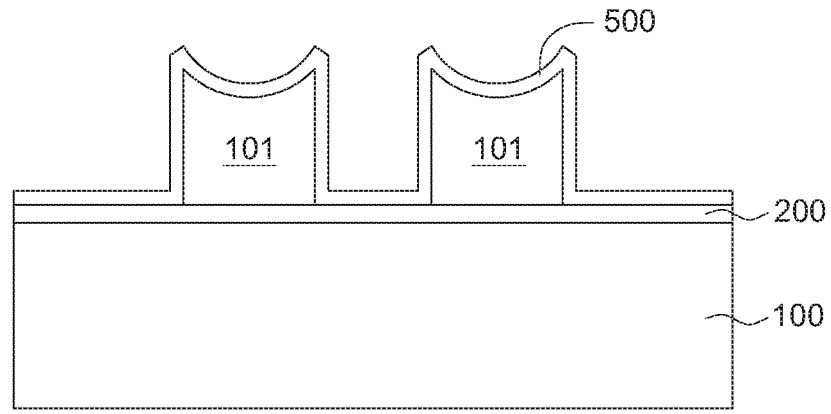
Figure 1F:
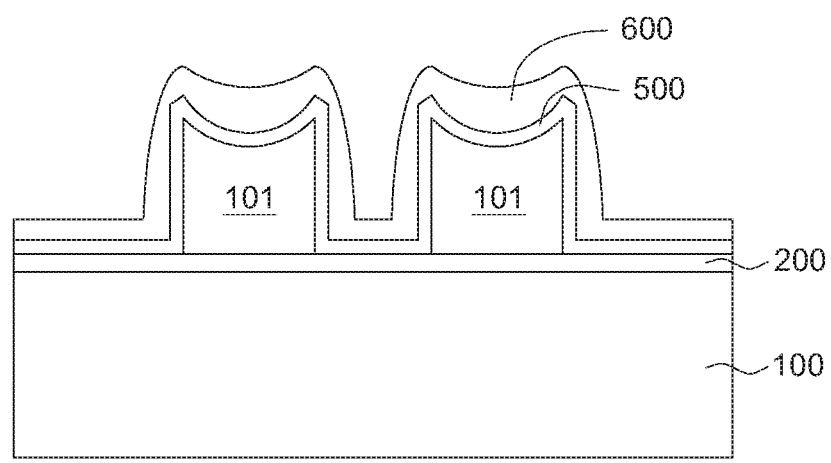

Referring to FIGS. 1E and 1F, form a dielectric material layer 500 and a dielectric material layer 600 on the floating gate 101 in order, wherein the dielectric material layer 500 and dielectric material layer 600 may be constituted of identical materials or different materials. For instance, the dielectric material layer 500 and dielectric material layer 600 may comprise silicon oxide ($SiO_x$), silicon oxynitride ($SiO_xN$) or a combination thereof, but the present disclosure is not limited thereto.

For instance, in the present embodiment, through deposit process, the dielectric material layer 500 and dielectric material layer 600 may be formed as two silicon oxide layers covering the gate dielectric material layer 200 and floating gate 101 in order. In another embodiment, the dielectric material layer 500 may be a silicon oxide dielectric lining layer formed on a surface of the floating gate 101 by thermal oxidation process, and the dielectric material layer 600 is formed as a silicon oxide layer covering the gate dielectric material layer 200 and dielectric material layer 500 through deposit process.

Figure 1G:
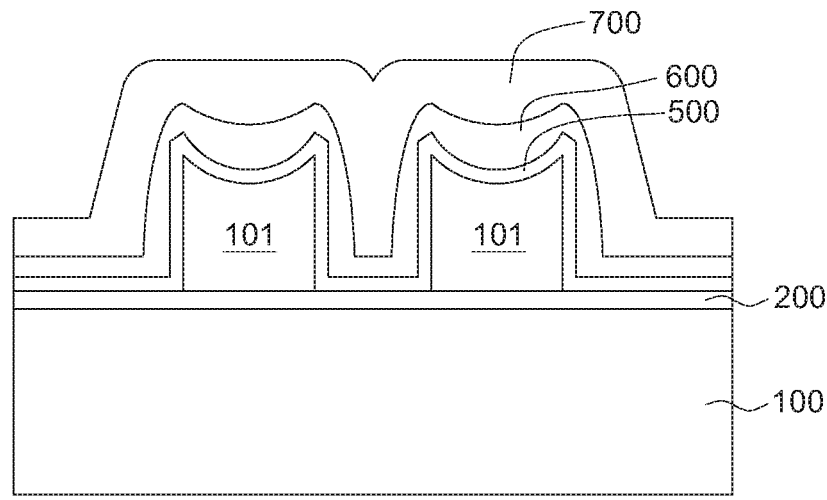

Referring to FIG. 1G, form a conductive material layer 700 on the dielectric material layer 600 through deposit process. For instance, the conductive material layer 700 may comprise doped poly-silicon, silicon (Si), germanium (Ge), metal, or other conductive material, but the present disclosure is not limited thereto. A thickness of the conductive material layer 700 is between 200 Å and 1000 Å, preferably 700 Å, but the present disclosure is not limited thereto.

Figure 1H:
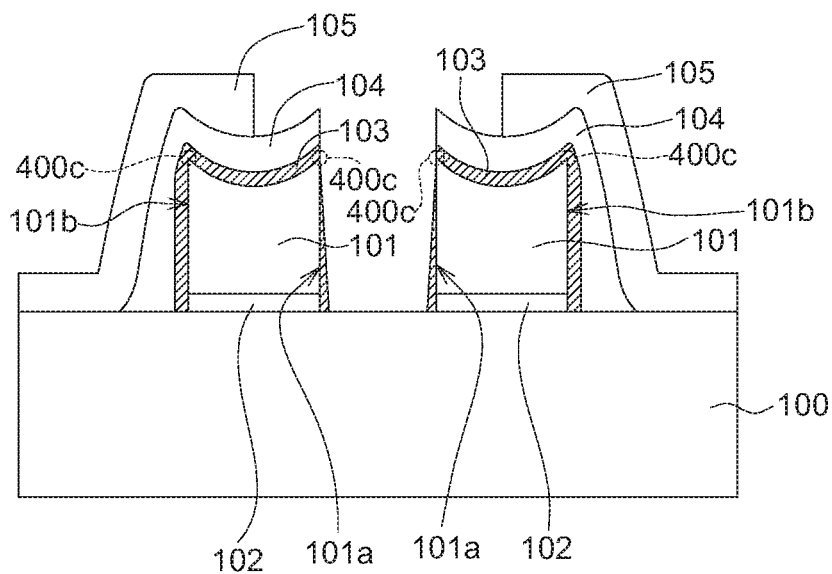

Referring to FIG. 1H, perform an etching process to complete the preparation of the semiconductor structure 10. In the present embodiment, the etching process is such as a poly-etch, but the present disclosure is not limited thereto. In the present embodiment, the semiconductor structure 10 comprises a substrate 100, a gate dielectric layer 102, a floating gate 101, a dielectric layer 103, a dielectric layer 104 and a control gate 105 stacked above the substrate 100 in order.

Detailed speaking, the gate dielectric layer 102 is disposed on the substrate 100. The floating gate 101 is disposed on the gate dielectric layer 102 and has two tips 400c on a top surface of the floating gate 101. The two tips 400c are on the two opposite sides of the top surface of the floating gate 101. The dielectric layer 103 is disposed on the floating gate 101. The dielectric layer 104 is disposed on the dielectric layer 103. The control gate 105 is disposed on the dielectric layer 104.

In the present embodiment, the control gate 105 at least partially overlaps the floating gate 101. That is, in a longitudinal direction, the control gate 105 does not completely overlap the floating gate 101. The control gate 105 partially covers a top surface of the dielectric layer 104. In other words, the control gate 105 does not completely cover the top surface of the dielectric layer 104. An inner sidewall 101a of the floating gate 101 is covered by the dielectric layer 103. For instance, the inner sidewall 101a of the floating gate 101 may also be completely covered by the dielectric layer 103, but the present disclosure is not limited thereto. An outer sidewall 101b of the floating gate 101 is covered by the dielectric layer 103. For instance, the outer sidewall 101b of the floating gate 101 may be completely covered by the dielectric layer 103, but the present disclosure is not limited thereto. A top surface of the floating gate 101 is covered by the dielectric layer 103. For instance, the top surface of the floating gate 101 may be completely covered by the dielectric layer 103, but the present disclosure is not limited thereto.

Second Embodiment

FIGS. 2A to 2G are cross-sectional views illustrating a series of the processing structure for fabricating a semiconductor structure 20, in accordance with second embodiment of the present disclosure. The manufacturing method of the semiconductor structure 20 of the second embodiment is similar to the manufacturing method of the semiconductor structure 10 of the first embodiment. The manufacturing method of the semiconductor structure 20 of the second embodiment is different from the manufacturing method of the semiconductor structure 10 of the first embodiment mainly in that the manufacturing method of the floating gate 201.

Figure 2A:
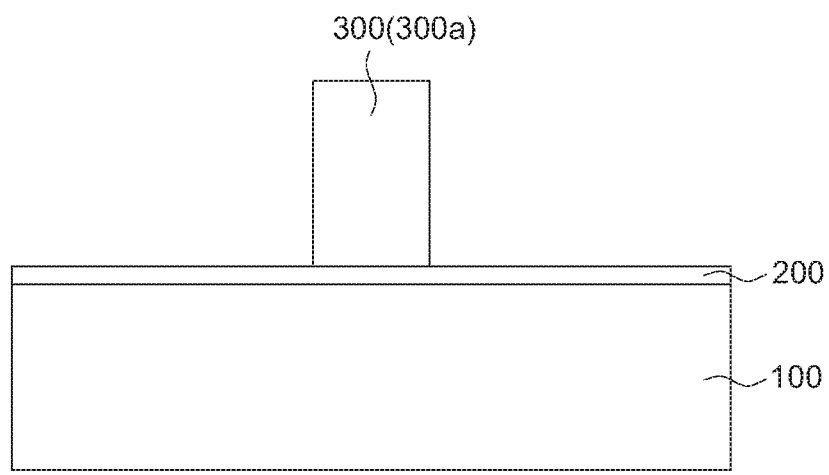
FIGS. 2A to 2G are cross-sectional views illustrating a series of the processing structure for fabricating a semiconductor structure, in accordance with second embodiment of the present disclosure.

Referring to FIG. 2A, firstly provide a substrate 100. Then form a gate dielectric material layer 200 on the substrate 100. Then form a patterned mask layer 300 above the substrate 100. In one embodiment, the patterned mask layer 300 may comprise patterned portions 300a, and the patterned portions 300a are on the gate dielectric material layer 200.

For instance, the substrate 100 may comprise silicon (Si), germanium (Ge) or gallium arsenide (GaAs), but the present disclosure is not limited thereto. For instance, the gate dielectric material layer 200 may comprise silicon oxide ($SiO_x$) or high k material, but the present disclosure is not limited thereto. For instance, the patterned portions 300a of the patterned mask layer 300 may comprise silicon nitride, but the present disclosure is not limited thereto. For example, in the present embodiment, the steps of forming the patterned mask layer 300 comprise: forming a silicon nitride layer on the gate dielectric material layer 200, performing a photoresist etching process, removing a portion of the silicon nitride layer, and forming the patterned mask layer 300 having the patterned portions 300a on the gate dielectric material layer 200.

Figure 2B:
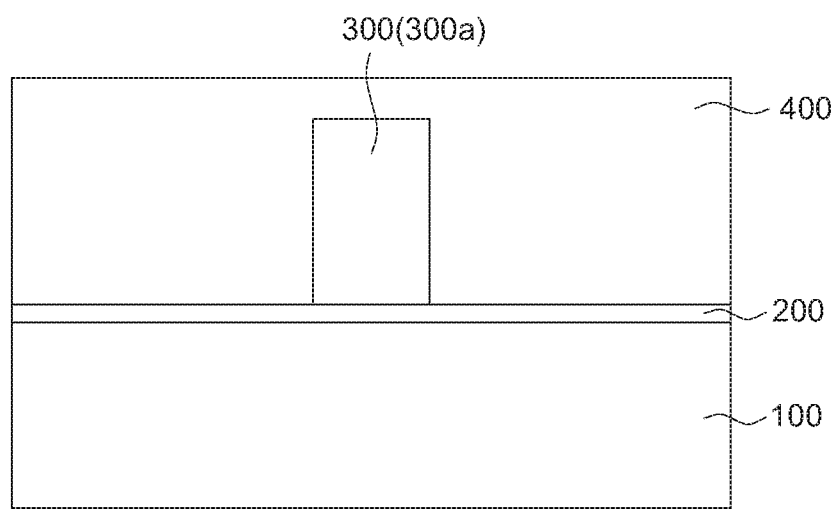

Referring to FIG. 2B, in the present embodiment, the patterned mask layer 300 may comprise a single patterned portion 300a. In one embodiment, deposit a conductive material layer 400 on the single patterned portion 300a of the patterned mask layer 300. For instance, the conductive material layer 400 may comprise (but not limited to) doped poly-silicon, silicon (Si), germanium (Ge), metal, or other conductive material.

Figure 2C:
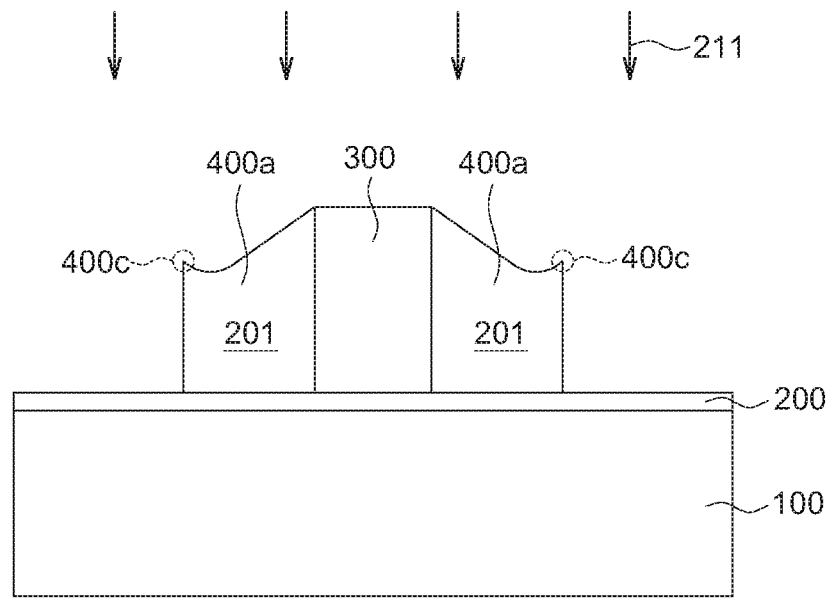

Referring to FIG. 2C, perform an etching process 211 using the patterned mask layer 300 as a stop layer without using any etching mask, to remove a portion of the conductive material layer 400. In one embodiment, the etching process 211 is such as an anisotropic etch or a blanket etch, but the present disclosure is not limited thereto. Due to the difference in etch selectivity between the patterned mask layer 300 and the conductive material layer 400, after the etching process 211, portions of the conductive material layer 400 remaining on two opposite sidewalls of an independent one of the pattern portions 300a form two conductive blocks 400a. Each of the two conductive blocks 400a has one single tip 400c. In one embodiment, one of the two conductive blocks 400a severs as a floating gate 201. In another embodiment, both of the two conductive blocks 400a sever as floating gates 201.

After removing the single patterned portion 300a of the patterned mask layer 300, remain conductive blocks 400a on the gate dielectric material layer 200. In one embodiment, each of the conductive blocks 400a may sever as a floating gate 201 of the semiconductor structure 20. For instance, a thickness of the floating gate 201 is between 200 Å and 1000 Å, but the present disclosure is not limited thereto. For briefly and clearly expressed, FIG. 2C illustrates only two conductive blocks 400a. However, in other embodiments, there may be more conductive blocks 400a on the gate dielectric material layer 200.

Figure 2D:
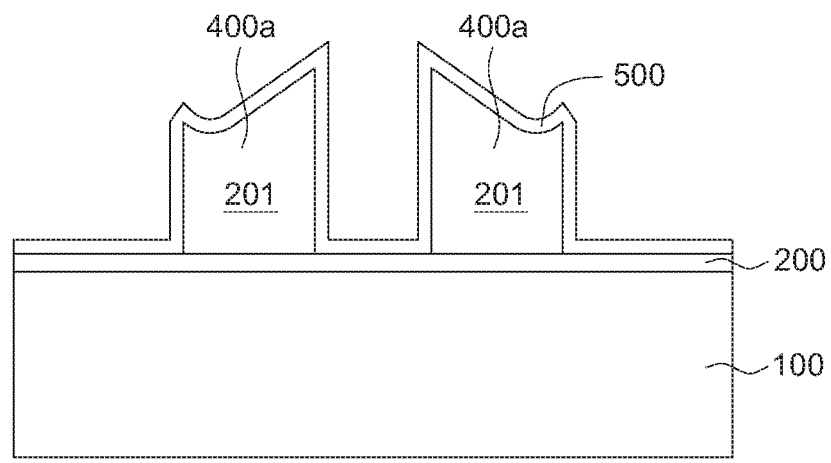
Figure 2E:
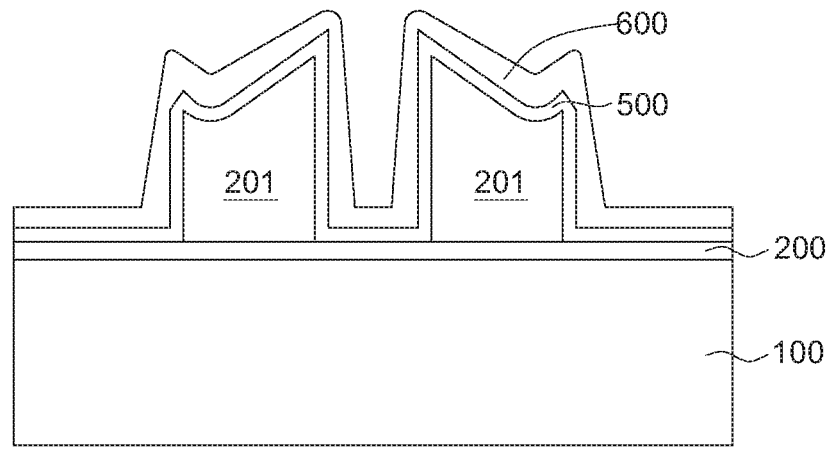

Referring to FIGS. 2D and 2E, deposit a dielectric material layer 500 and a dielectric material layer 600 on the floating gate 201 in order, wherein the dielectric material layer 500 and dielectric material layer 600 may be constituted of identical materials or different materials. For instance, the dielectric material layer 500 and dielectric material layer 600 may comprise silicon oxide ($SiO_x$), silicon oxynitride ($SiO_xN$) or a combination thereof, but the present disclosure is not limited thereto.

For instance, in the present embodiment, through deposit process, the dielectric material layer 500 and dielectric material layer 600 may be formed as two silicon oxide layers covering the gate dielectric material layer 200 and floating gate 201 in order. In another embodiment, the dielectric material layer 500 may be a silicon oxide dielectric lining layer formed on a surface of the floating gate 201 by thermal oxidation process, and the dielectric material layer 600 is formed as a silicon oxide layer covering the gate dielectric material layer 200 and dielectric material layer 500 through deposit process.

Figure 2F:
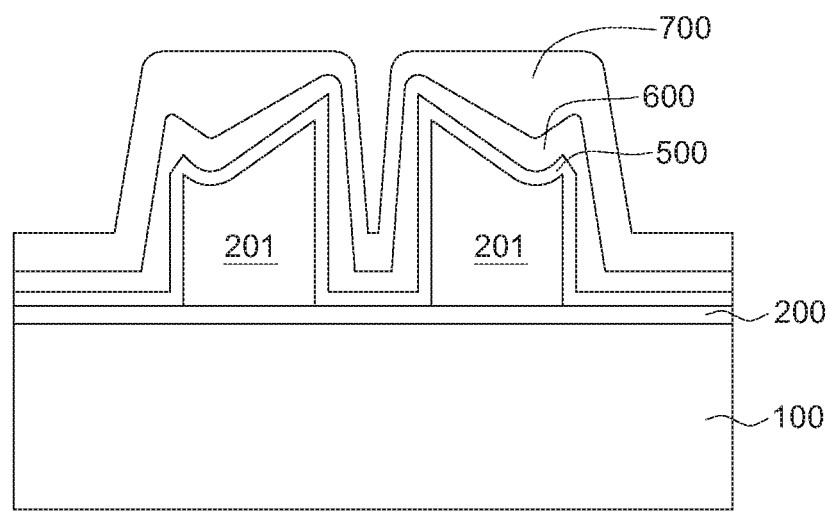

Referring to FIG. 2F, form a conductive material layer 700 on the dielectric material layer 600 through deposit process. For instance, the conductive material layer 700 may comprise doped poly-silicon, silicon (Si), germanium (Ge), metal, or other conductive material, but the present disclosure is not limited thereto. A thickness of the conductive material layer 700 is between 200 Å and 1000 Å, preferably 700 Å, but the present disclosure is not limited thereto.

Figure 2G:
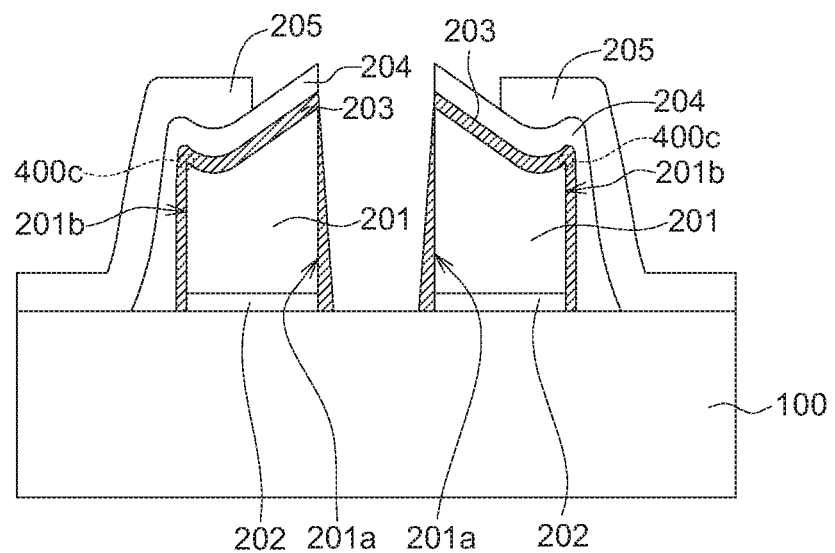

Referring to FIG. 2G, perform an etching process to complete the preparation of the semiconductor structure 20. In the present embodiment, the etching process is such as a poly-etch, but the present disclosure is not limited thereto. In the present embodiment, the semiconductor structure 20 comprises a substrate 100, a gate dielectric layer 202, a floating gate 201, a dielectric layer 203, a dielectric layer 204 and a control gate 205 stacked above the substrate 100 in order.

Detailed speaking, the gate dielectric layer 202 is disposed on the substrate 100. The floating gate 201 is disposed on the gate dielectric layer 202 and has one single tip 400c on a top surface of the floating gate 201. The one single tip 400c is adjacent the control gate 205. The dielectric layer 203 is disposed on the floating gate 201. The dielectric layer 204 is disposed on the dielectric layer 203. The control gate 205 is disposed on the dielectric layer 204.

In the present embodiment, the control gate 205 at least partially overlaps the floating gate 201. That is, in a longitudinal direction, the control gate 205 does not completely overlap the floating gate 201. The control gate 205 partially covers a top surface of the dielectric layer 204. In other words, the control gate 205 does not completely cover the top surface of the dielectric layer 204. An inner sidewall 201a of the floating gate 201 is covered by the dielectric layer 203. For instance, the inner sidewall 201a of the floating gate 201 may also be completely covered by the dielectric layer 203, but the present disclosure is not limited thereto. An outer sidewall 201b of the floating gate 201 is covered by the dielectric layer 203. For instance, the outer sidewall 201b of the floating gate 201 may be completely covered by the dielectric layer 203, but the present disclosure is not limited thereto. A top surface of the floating gate 201 is covered by the dielectric layer 203. For instance, the top surface of the floating gate 201 may be completely covered by the dielectric layer 203, but the present disclosure is not limited thereto.

According to the above embodiments of the present application, a semiconductor structure is disclosed. The semiconductor structure comprises a substrate, a gate dielectric layer, a floating gate, a first dielectric layer and a control gate. The gate dielectric layer is disposed on the substrate. The floating gate is disposed on the gate dielectric layer and has at least one tip on a top surface of the floating gate. The first dielectric layer is disposed on the floating gate. The control gate is disposed above the first dielectric layer and at least partially overlaps the floating gate.

By disposing a floating gate having one tip and disposing a control gate at least partially overlapping the floating gate, the present application have advantages of reducing the erase path between the floating gate and control gate, reducing the memory cell size, enhancing process quality, lowering operation voltage, increasing endurance, and achieving high-speed program and erase operations.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a substrate,
a gate dielectric layer, disposed on the substrate;
a floating gate, disposed on the gate dielectric layer and having two tips on two opposite sides of a top surface of the floating gate, wherein the two tips have different levels measured from the substrate; and a bottom surface of the floating gate connecting to the gate dielectric layer is a plane surface;
a first dielectric layer, disposed on the floating gate; and
a control gate, disposed above the first dielectric layer and at least partially overlaps the floating gate.

2. The semiconductor structure according to claim 1, further comprising:
a second dielectric layer, disposed on the first dielectric layer, wherein the control gate partially covers a top surface of the second dielectric layer.

3. The semiconductor structure according to claim 1, wherein an outer sidewall of the floating gate is covered by the first dielectric layer.

4. The semiconductor structure according to claim 1, wherein an inner sidewall of the floating gate is covered by the first dielectric layer.

5. The semiconductor structure according to claim 1, wherein the top surface of the floating gate is covered by the first dielectric layer.

6. The semiconductor structure according to claim 1, wherein a thickness of the floating gate is between 200 Å and 1000 Å.

7. The semiconductor structure according to claim 1, wherein a thickness of the control gate is between 200 Å and 1000 Å.

8. A method for manufacturing a semiconductor structure, comprising:
providing a substrate;
forming a gate dielectric layer on the substrate;
forming a floating gate on the gate dielectric layer, wherein the floating gate has at least one tip on a top surface of the floating gate wherein forming the floating gate comprises:
forming a patterned mask layer above the substrate;
depositing a conductive material layer on the patterned mask layer;
performing an etching process by using the patterned mask layer as a stop layer to remove a portion of the conductive material layer; and
removing the patterned mask layer to form the floating gate;
forming a first dielectric layer on the floating gate; and
forming a control gate above the first dielectric layer, wherein the control gate at least partially overlaps the floating gate.

9. The method according to claim 8, wherein the patterned mask layer comprises a plurality of patterned portions; and after the etching process, a portion of the conductive material layer remaining between adjacent two of the plurality of patterned portions forms a conductive block, and the conductive block has a top recess and two tips on two opposite sides of the top recess.

10. The method according to claim 9, wherein the conductive block serves as the floating gate.

11. The method according to claim 8, wherein the patterned mask layer comprises a plurality of patterned portions; and after the etching process, portions of the conductive material layer remaining on two opposite sidewalls of an independent one of the plurality of patterned portions form two conductive blocks, and each of the two conductive blocks has one single tip.

12. The method according to claim 11, wherein the two conductive blocks serve as the floating gate.

13. The method according to claim 8, wherein the patterned mask layer comprises silicon nitride.

14. The method according to claim 8, wherein an outer sidewall of the floating gate is covered by the first dielectric layer.

15. The method according to claim 8, further comprising:
forming a second dielectric layer on the first dielectric layer, wherein the control gate partially covers a top surface of the second dielectric layer.

16. The method according to claim 8, wherein an inner sidewall of the floating gate is covered by the first dielectric layer.

17. The method according to claim 8, wherein the top surface of the floating gate is covered by the first dielectric layer.

* * * * *